(12) United States Patent
Izumitani

(10) Patent No.: US 11,011,548 B2
(45) Date of Patent: May 18, 2021

(54) ELECTRONIC DEVICE AND METHOD OF MANUFACTURING THE SAME

(71) Applicant: Murata Manufacturing Co., Ltd., Nagaokakyo (JP)

(72) Inventor: Junko Izumitani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/399,227

(22) Filed: Apr. 30, 2019

(65) Prior Publication Data

US 2019/0259779 A1    Aug. 22, 2019

Related U.S. Application Data

(63) Continuation of application No. PCT/JP2017/045669, filed on Dec. 20, 2017.

(30) Foreign Application Priority Data

Dec. 26, 2016 (JP) .............................. JP2016-250921

(51) Int. Cl.
| | | |
|---|---|---|
| *B81B 3/00* | (2006.01) | |
| *H01L 27/12* | (2006.01) | |
| *H01L 21/762* | (2006.01) | |
| *H01L 21/768* | (2006.01) | |
| *H01L 23/532* | (2006.01) | |

(52) U.S. Cl.
CPC ........ *H01L 27/1203* (2013.01); *H01L 21/768* (2013.01); *H01L 21/76243* (2013.01); *H01L 23/532* (2013.01)

(58) Field of Classification Search
None
See application file for complete search history.

(56) References Cited

U.S. PATENT DOCUMENTS

| | | | |
|---|---|---|---|
| 6,388,300 B1 | 5/2002 | Kano et al. | |
| 2004/0251229 A1* | 12/2004 | Okumura | ............ B81C 1/00158 216/2 |

FOREIGN PATENT DOCUMENTS

| | | |
|---|---|---|
| JP | H05218015 A | 8/1993 |
| JP | H07130845 A | 5/1995 |
| JP | 2000286430 A | 10/2000 |
| JP | 2011252834 A | 12/2011 |
| JP | 2015118200 A | 6/2015 |
| WO | 2007026177 A1 | 3/2007 |
| WO | 2015017794 A1 | 2/2015 |

OTHER PUBLICATIONS

International Search Report issued for PCT/JP2017/045669, dated Feb. 6, 2018.
Written Opinion of the International Searching Authority issued for PCT/JP2017/045669, dated Feb. 6, 2018.

* cited by examiner

*Primary Examiner* — Reema Patel
(74) *Attorney, Agent, or Firm* — Arent Fox LLP

(57) ABSTRACT

An electronic device includes a plurality of layers formed on a silicon-on-insulator (SOI) substrate. The SOI substrate includes a support substrate, a buried insulating layer formed on the support substrate, and a silicon layer formed on the buried insulating layer. A membrane structure of the electronic device includes the plurality of layers, the buried insulating later and the silicon layer but does not include the support substrate. A passivation film covers an upper surface and a side surface of the membrane structure.

10 Claims, 13 Drawing Sheets

ELECTRONIC DEVICE AND METHOD OF MANUFACTURING THE SAME

CROSS REFERENCE TO RELATED APPLICATIONS

The present application is a continuation of International application No. PCT/JP2017/045669, filed Dec. 20, 2017, which claims priority to Japanese Patent Application No. 2016-250921, filed Dec. 26, 2016, the entire contents of each of which are incorporated herein by reference.

TECHNICAL FIELD

The present invention relates to an electronic device having a membrane structure and a method of manufacturing the same.

BACKGROUND OF THE INVENTION

In recent years, attention has been drawn to techniques for fabricating a membrane structure using a silicon-on-insulator (SOI) substrate, and forming sensors, resonators, and communication devices using such membrane structures. A membrane structure is a thin film element including a silicon layer formed by a portion where a thick support substrate in the SOI substrate is removed. The membrane structure also includes what is called a MEMS element.

Examples of such an electronic device (a gas sensor) having such a membrane structure are described in WO2015/017794 (Patent Document) and 02007/026177 (Patent Document 2). In these gas sensors, a part of a support substrate in an SOI substrate is removed to form a membrane structure including a transistor and a wiring layer, so as to constitute a gas sensor element by the membrane structure.

In the techniques disclosed in Patent Documents 1 and 2, the membrane structure is fabricated by patterning a wafer from above and below after a fabricating method equivalent to that of ordinary Si-CMOS is performed, but in the structure at this time, on a side surface of the membrane structure, an interlayer insulating film remains exposed. Since the interlayer insulating film is not only a film for insulating between wiring layers but is also required to reduce a step, a film exhibiting an effect of smoothing a step portion, such as SOG, BPTEOS, BPSG, or the like, is used. On the other hand, such an interlayer insulating film is liable to absorb water components in gas and air, and repeats separation and suction/absorption of gas and water components depending on the temperature.

In this way, when gas or moisture enters through a side surface of the membrane structure during operation of the electronic device, problems possibly occur, such as corrosion of the wiring layers, peeling of the interlayer insulating film, and characteristic fluctuation due to change in motion of the membrane structure. Furthermore, when the interlayer insulating film peels off, the peeling off also leads to destruction of the membrane structure, which adversely affects device reliability.

The present invention has been made in view of such circumstances, and an object thereof is to provide an electronic device and a method of manufacturing the same, which can prevent, or at least reduce, entrance of gas and moisture through a side surface of the membrane structure.

BRIEF SUMMARY OF THE INVENTION

An electronic device according to one embodiment of the present invention includes: a plurality of layers formed on a silicon-on-insulator (SOI) substrate including a support substrate, a buried insulating layer formed on the support substrate, and a silicon layer formed on the buried insulating layer; a membrane structure in which the plurality of layers and the SOI substrate are patterned, the membrane structure being constituted of a portion where the support substrate is absent; and a passivation film covering an upper surface and a side surface of the membrane structure.

A method of manufacturing an electronic device according to one aspect of the present invention includes: a step of forming a plurality of layers on a silicon-on-insulator (SOI) substrate including a support substrate, a buried insulating layer formed on the support substrate, and a silicon layer formed on the buried insulating layer; a step of forming a pattern of a membrane structure by removing a layer from the plurality of layers to the buried insulating layer in a partial region; and a step of forming a passivation film covering an upper surface and a side surface of the membrane structure.

Advantageous Effect of the Invention

According to the present invention, it is possible to provide an electronic device and a method of manufacturing the same, which can prevent entrance of gas and moisture through a side surface of the membrane structure.

DETAILED DESCRIPTION OF THE PREFERRED EMBODIMENT

Figure 1:
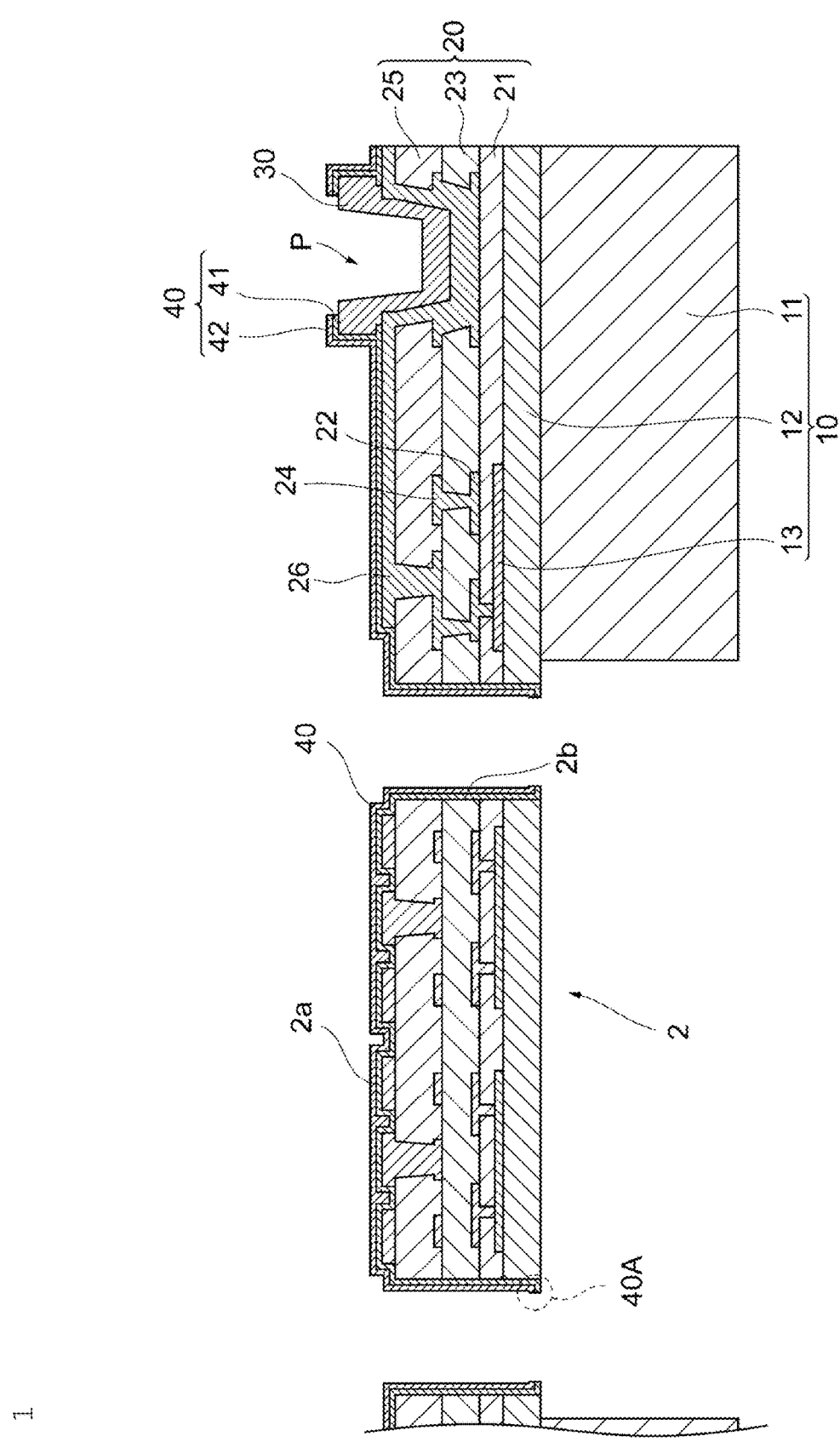
FIG. 1 is a schematic cross-sectional view of a section of an electronic device according to a present embodiment.

A preferred embodiment of the present invention will be described with reference to the accompanying drawings. (Note that in the drawings, the same reference numerals are given to components having the same or similar configurations.)

FIG. 1 is a schematic cross-sectional view of a portion of an electronic device according to the present embodiment and includes a silicon-on-insulator (SOI) substrate 10 including a support substrate 11, a buried insulating layer 12 formed on the support substrate 11, and a silicon layer 13 formed on the buried insulating layer 12.

On the SOI substrate 10, a three-layer wiring structure 20 is formed. The wiring structure 20 includes an interlayer insulating film 21 formed on the SOI substrate 10, a wiring layer 22 formed on the interlayer insulating film 21, an interlayer insulating film 23 formed to cover the wiring layer 22, a wiring layer 24 formed on the interlayer insulating film 23, an interlayer insulating film 25 formed to cover the wiring layer 24, and a wiring layer 26 formed on the interlayer insulating film 25. Upper and lower wiring layers are electrically connected by contact plugs penetrating the interlayer insulating films. A pad P corresponding to a connecting part (for connection to the outside, i.e., an external device) is formed by the wiring layers 22, 24, 26, and an external electrode 30 is formed on the pad P. In a portion where the external electrode 30 is formed, the interlayer insulating films 23 and 25 are removed.

The wiring layers 22, 24, 26 are preferably made of a metal material containing W, Al or Cu as a main component. For a lower layer of these metal material layers, Ti and TiN, or Ta and TaN are preferably used as a close contact layer and a barrier metal. As the interlayer insulating films 21, 23, 25, a film having an effect of smoothing a step portion, such as SOG, BPTEOS, BPSG or the like is preferably used.

A membrane structure 2 is formed by patterning the wiring structure 20 formed on the SOI substrate 10. In the portion of the membrane structure 2, the support substrate 11 of the SOI substrate 10 is removed. Thus, the membrane structure 2 including the buried insulating layer 12, the silicon layer 13, and the wiring structure 20 is formed. The membrane structure is a thin film element including a silicon layer formed by a portion where a thick support substrate is removed in the SOI substrate.

As illustrated in FIG. 1, left and right sides of the membrane structure 2 are separated from the other wiring structure 20 of the SOI substrate, but the membrane structure 2 is connected to the wiring structure 20 in other portions. A plurality of the membrane structures 2 may be formed. In the electronic device 2, the membrane structure 2 may be configured to vibrate. The electronic device having the membrane structure 2 is used, for example, for a sensor, a resonator, and a communication device.

In the present embodiment, an upper surface 2a and a side surface 2b of the membrane structure 2 are covered with a continuous passivation film 40. Similarly, an upper surface and a side surface of the wiring structure 20 other than the membrane structure 2 are also covered with the continuous passivation film 40.

The passivation film 40 is preferably formed of a stacked film of a silicon oxide film 41 and a silicon nitride film 42. The silicon oxide film 41 is provided to improve the close contact between the interlayer insulating films 21, 23, 25 and the silicon nitride film 42 on the side surface of the membrane structure 2. The silicon nitride film 42 is provided to block gas and moisture.

The passivation film 40 preferably has a protrusion 40A of 5 µm or less at a lower part of the side surface 2b of the membrane structure 2. The protrusion 40A inevitably occurs when the passivation film 40 is processed.

In the electronic device according to the present embodiment, since the upper surface 2a and the side surfaces 2b of the membrane structure 2 are covered with the continuous passivation film 40, it is possible to prevent moisture and various gas components from entering through the side surface 2b of the membrane structure 2, and thereby improve stability of electronic device characteristics. In addition, it is possible to prevent corrosion of metal wiring and film peeling of the interlayer insulating film, and thereby improve reliability of the electronic device. In the electronic device including the membrane structure 2, since the membrane structure 2 vibrates, stress applied to a membrane interface also increases. According to the present embodiment, by covering the side surface 2b of the membrane structure 2 with the continuous passivation film 40, mechanical strength of the membrane structure 2 can also be increased.

Next, a preferred method of manufacturing the electronic device illustrated in FIG. 1 will be described with reference to FIGS. 2 to 13.

Figure 2:
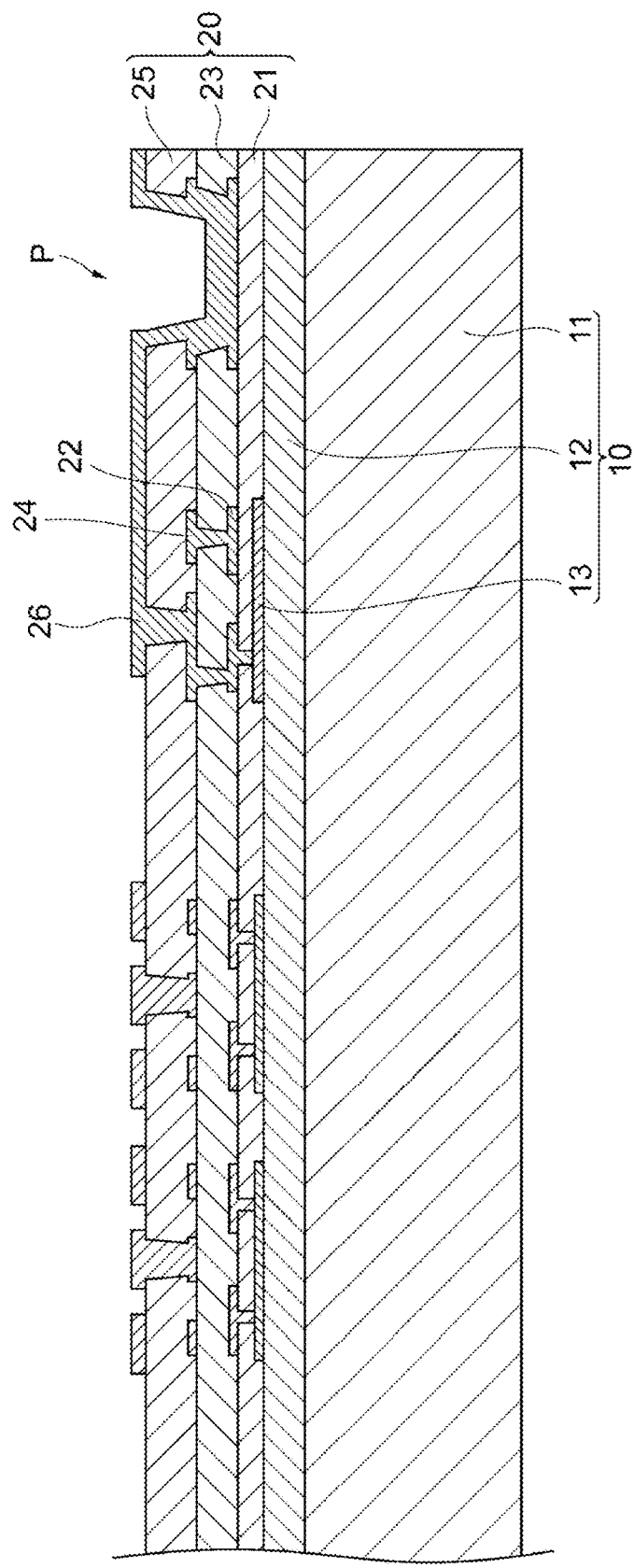
FIG. 2 is a process cross-sectional view of a method of manufacturing the electronic device according to the present embodiment.

As illustrated in FIG. 2, a wiring structure 20 is formed on an SOI substrate 10. Specifically, after a silicon layer 13 is patterned, an interlayer insulating film 21 is formed on the SOI substrate 10, a contact holes are formed in the interlayer insulating film 21, a conductive layer which fills the contact holes is formed thereafter, and a pattern of a wiring layer 22 is formed on the interlayer insulating film 21. The same operation is repeated to form an interlayer insulating film 23, a wiring layer 24, an interlayer insulating film 25, and a wiring layer 26. Further, as illustrated in FIG. 2, a pad P is formed by a part of the wiring layers 22, 24, 26.

Figure 3:
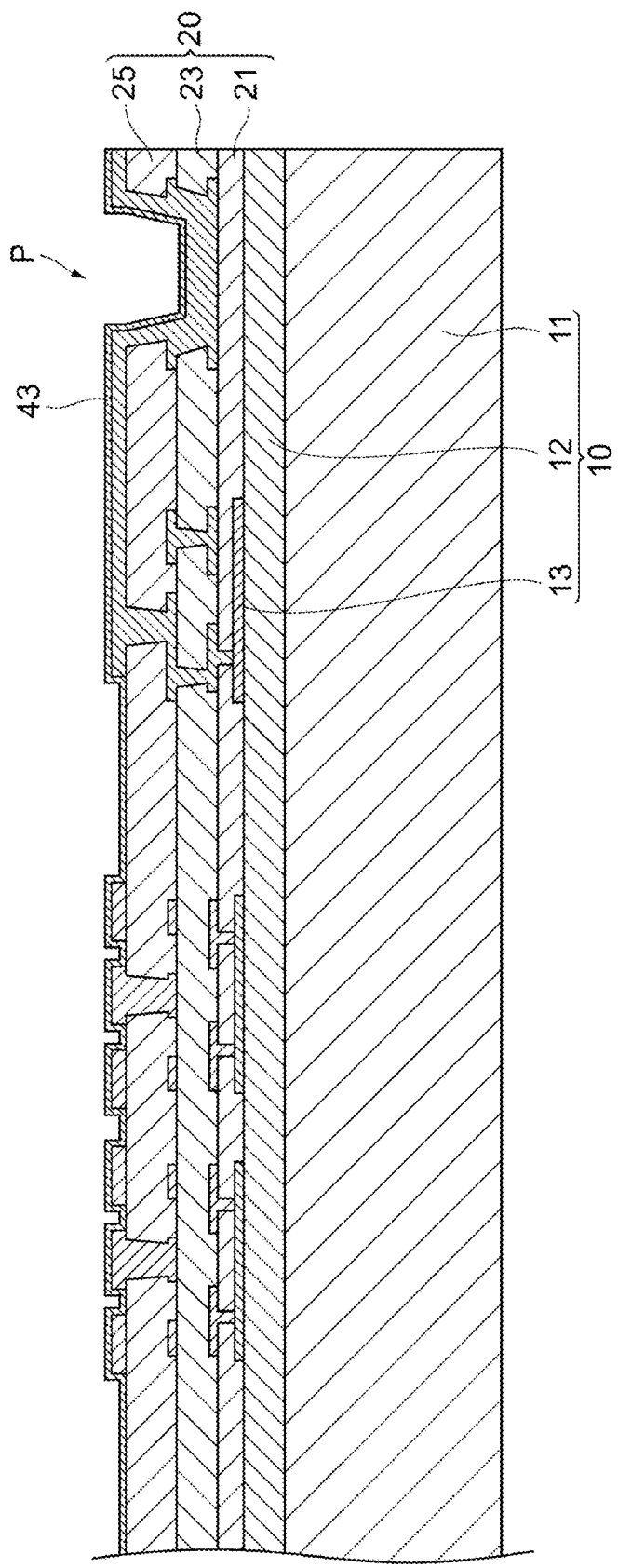
FIG. 3 is a process cross-sectional view of the method of manufacturing the electronic device according to the present embodiment.

Next, as illustrated in FIG. 3, a thin (approximately 100 nm or less) silicon oxide film (SiOx) 43 film is preferably formed on the uppermost wiring layer 26 by plasma CVD or HDP-CVD. If the uppermost wiring layer 26 has a property of being dissolved in an alkaline solution when a resist pattern for processing the membrane (surface) is directly applied, it is possible that a developer permeates for some reason and etches the wiring layer 26. In order to suppress yield deterioration factors, the thin silicon oxide film 43 is preferably formed first, so as to protect the wiring pattern. When such a problem does not exist, the silicon oxide film 43 may be omitted.

Figure 4:
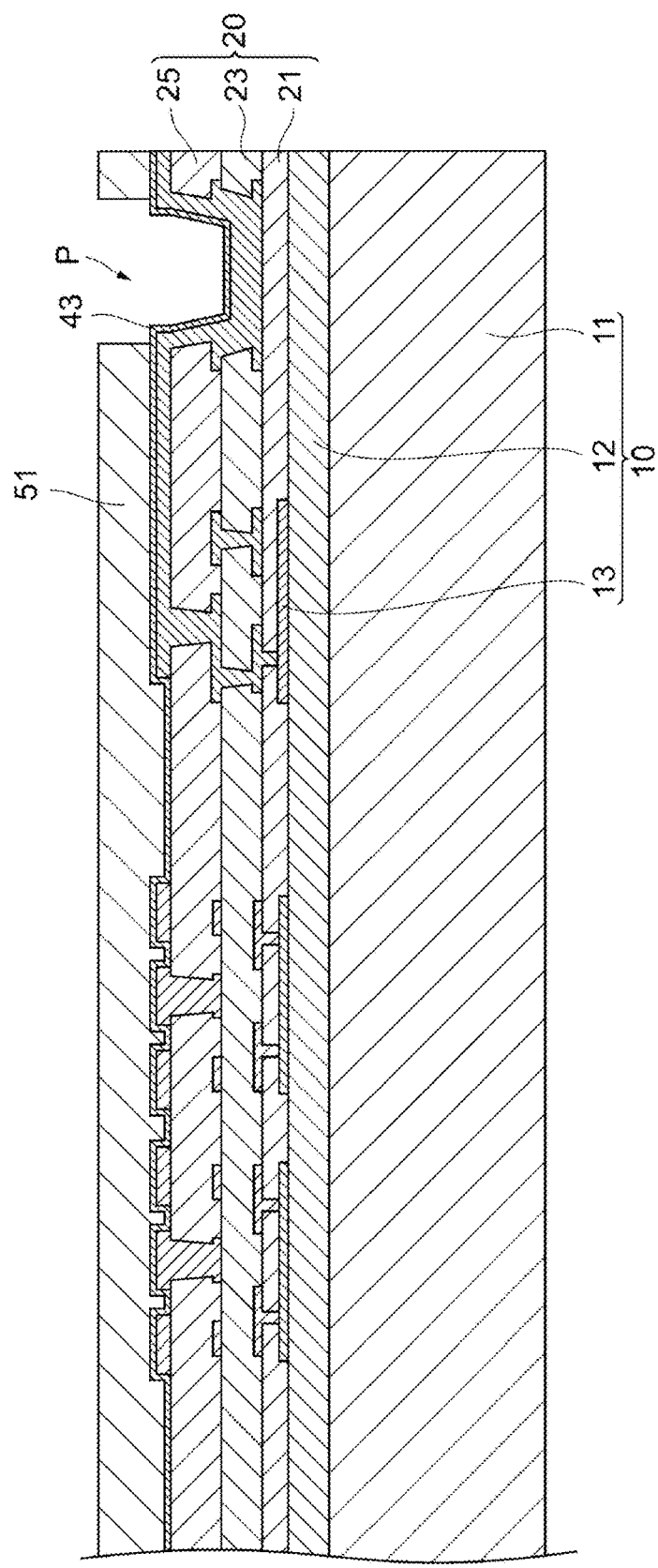
FIG. 4 is a process cross-sectional view of the method of manufacturing the electronic device according to the present embodiment.

Next, as illustrated in FIG. 4, a resist film 51 is formed, and a cavity is formed in the resist film 51 at the location of the pad P by exposure and development.

Figure 5:
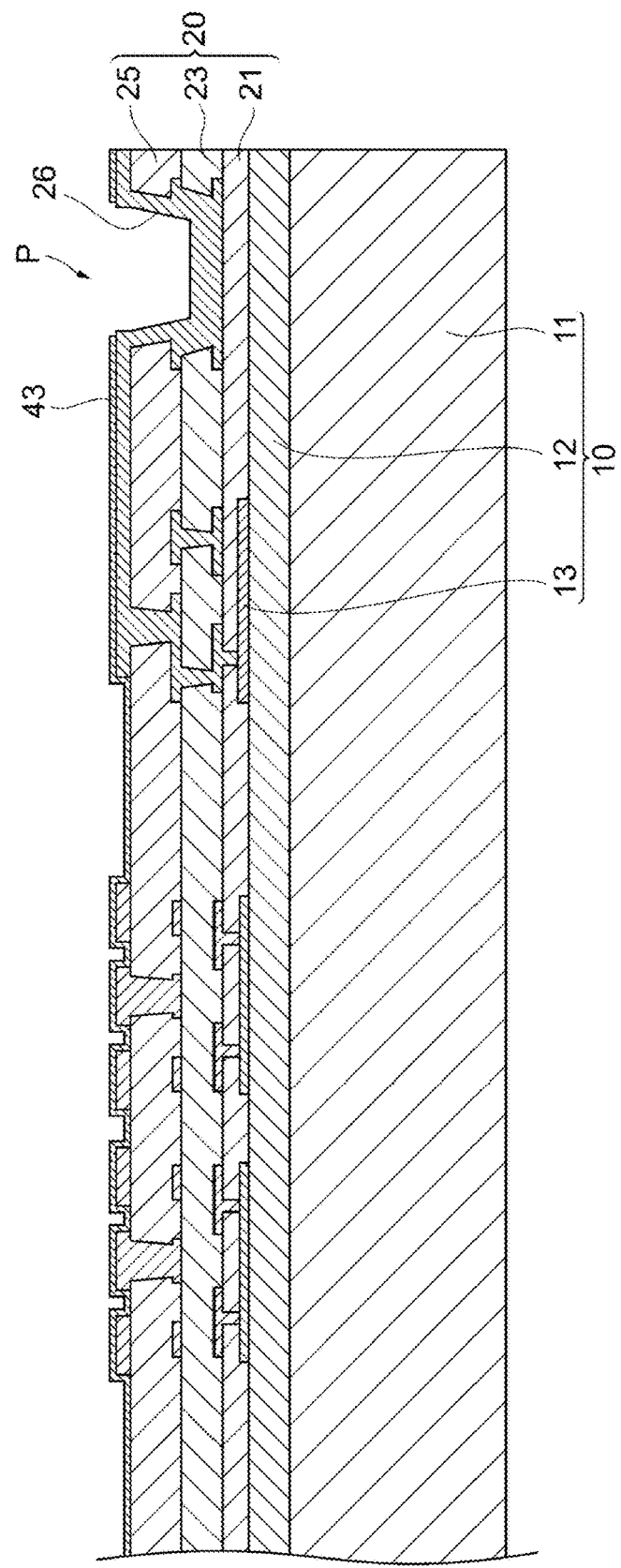
FIG. 5 is a process cross-sectional view of the method of manufacturing the electronic device according to the present embodiment.

Thereafter, as illustrated in FIG. 5, using the resist film 51 as a mask, the silicon oxide film 43 located in the pad is removed by etching, and then the resist film 51 is removed.

Figure 6:
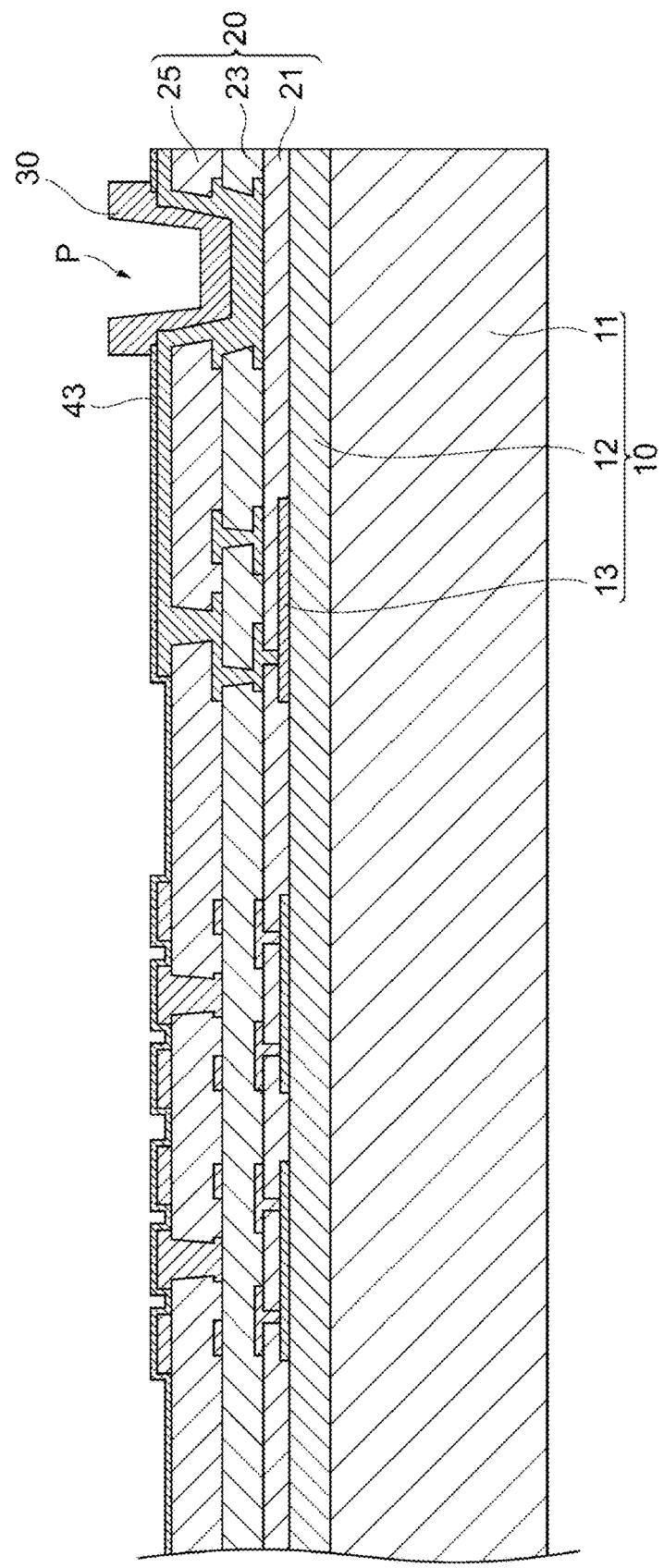
FIG. 6 is a process cross-sectional view of the method of manufacturing the electronic device according to the present embodiment.

Next, as illustrated in FIG. 6, an external electrode 30 connected to the pad P is formed. When the pad P is, for example, soldered to the outside, it is preferably that the external electrode 30 contain Ni or Au as a main component. When the wiring layer 26 of the uppermost layer is W and wire bonding is performed to the outside, it is preferable that the external electrode 30 contain Al as a main component.

Figure 7:
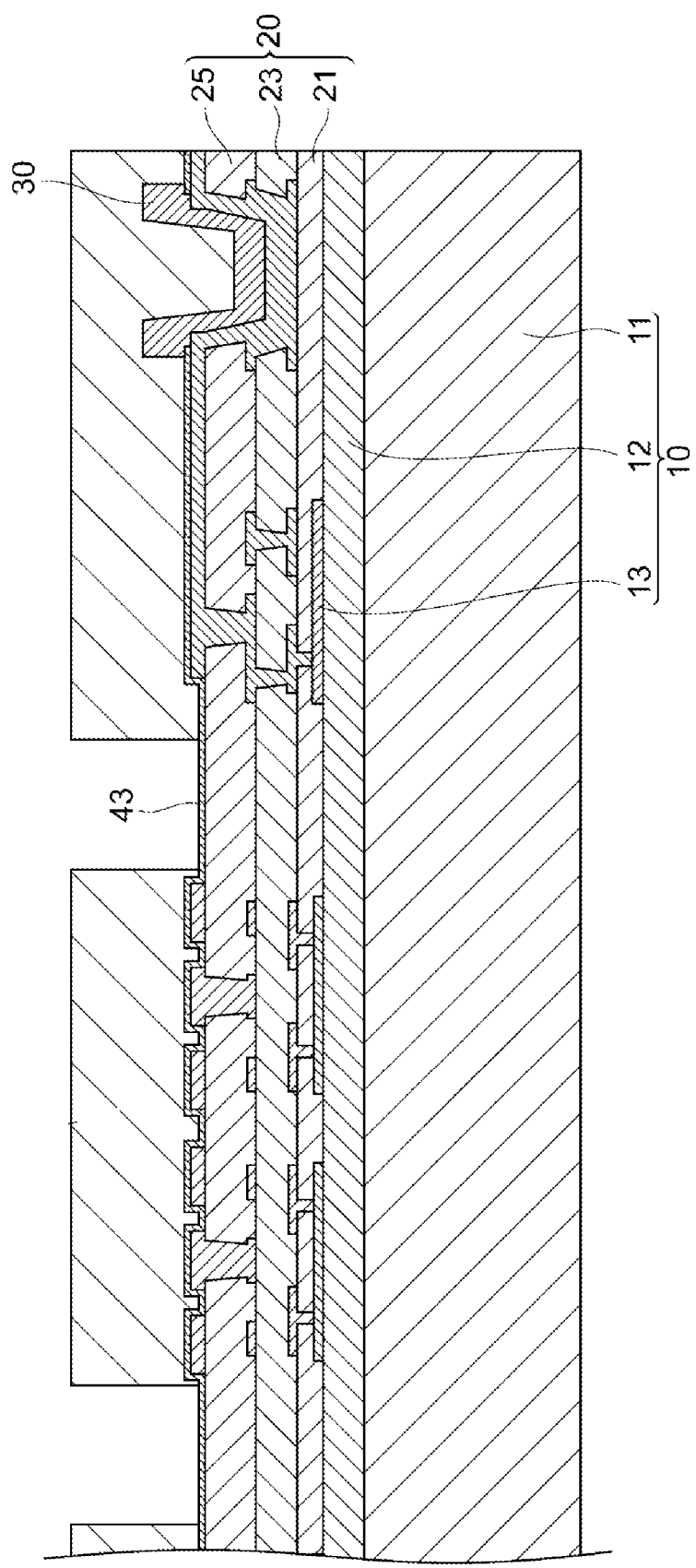
FIG. 7 is a process cross-sectional view of the method of manufacturing the electronic device according to the present embodiment.

Next, as illustrated in FIG. 7, a resist film 52 is formed, and pattern cavities for forming the membrane structure 2 are formed by exposure and development.

Figure 8:
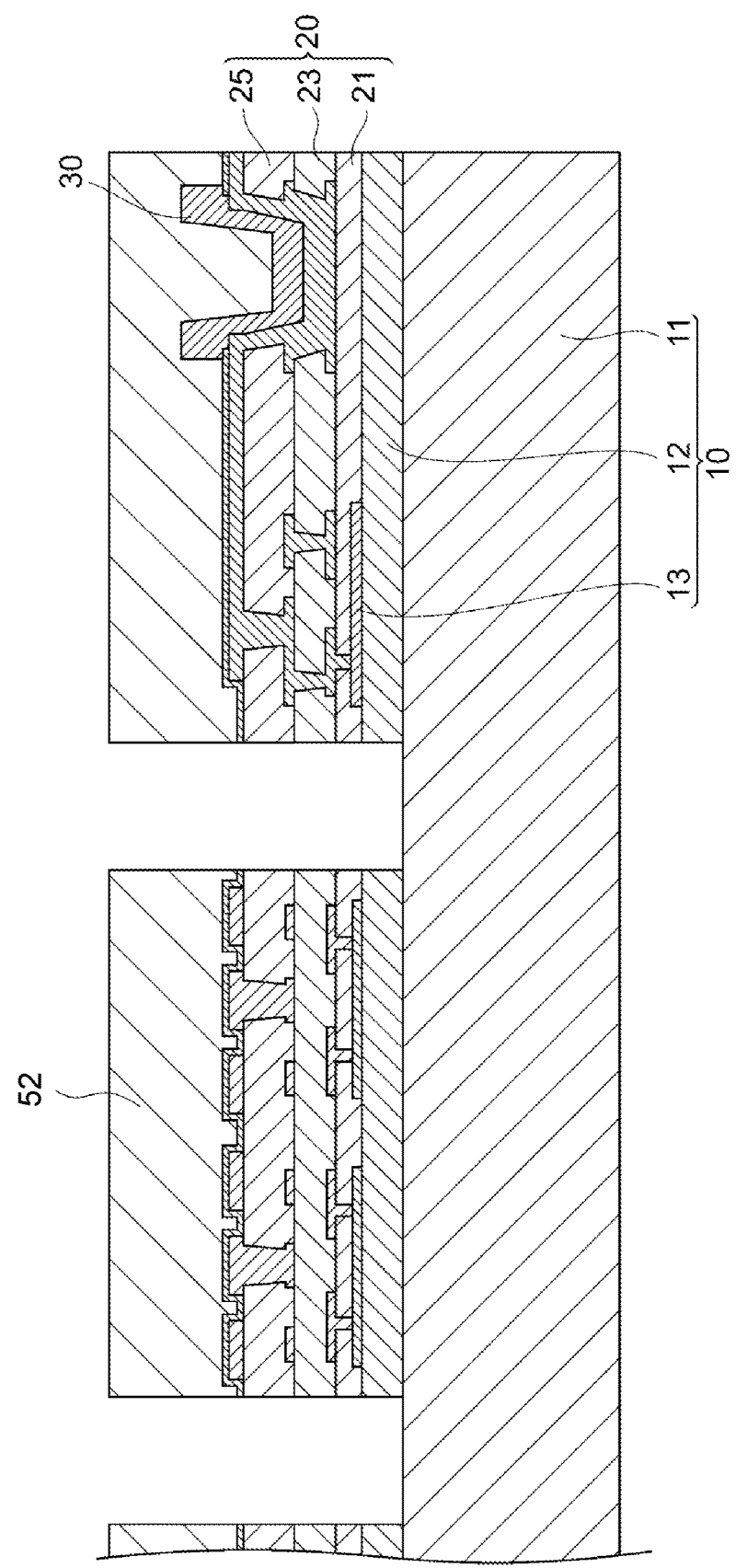
FIG. 8 is a process cross-sectional view of the method of manufacturing the electronic device according to the present embodiment.
Figure 9:
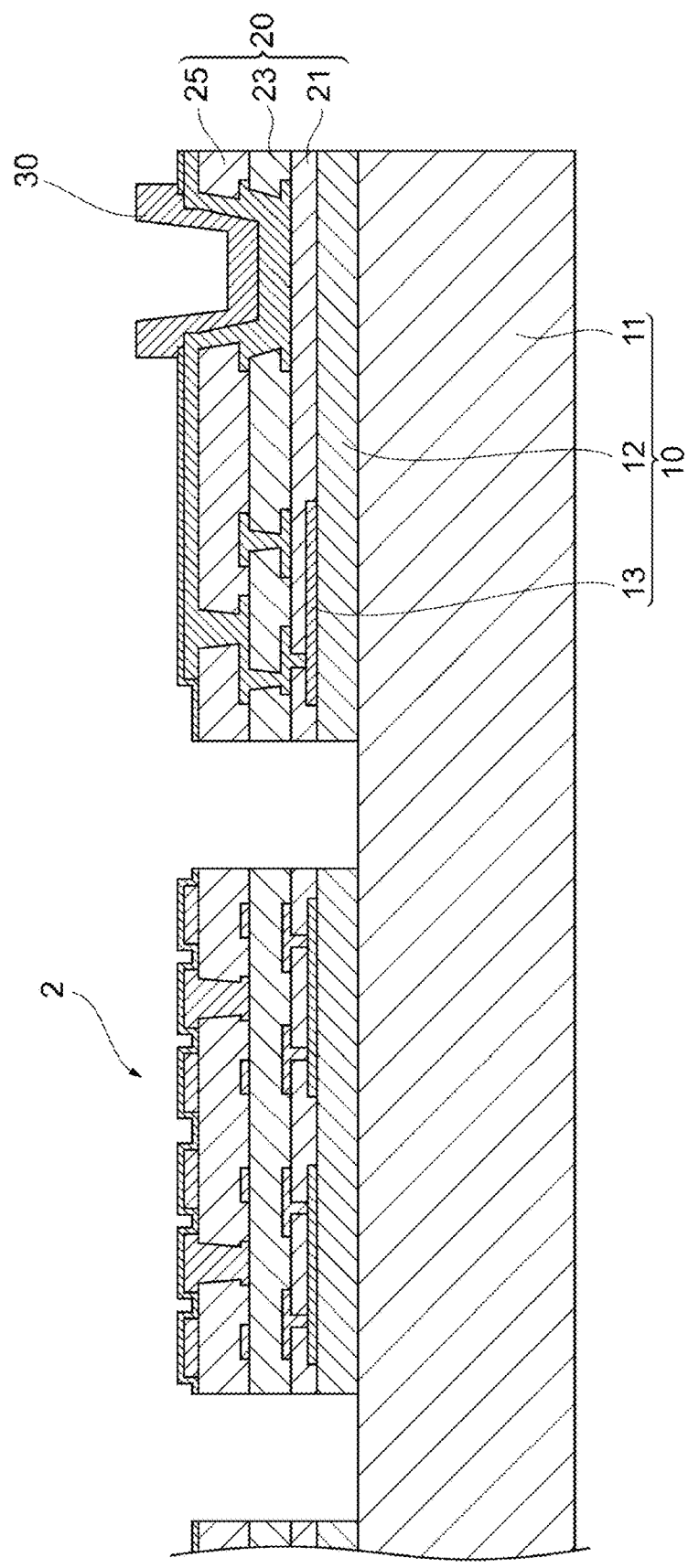
FIG. 9 is a process cross-sectional view of the method of manufacturing the electronic device according to the present embodiment.

Next, as illustrated in FIG. 8, using the resist film 52 as a mask, the layers from the silicon oxide film 43 to the buried insulating layer 12 are etched to form a pattern of the membrane structure 2. At the same time, a dicing line portion is also etched. Thereafter, the resist film 52 is removed (FIG. 9).

Figure 10:
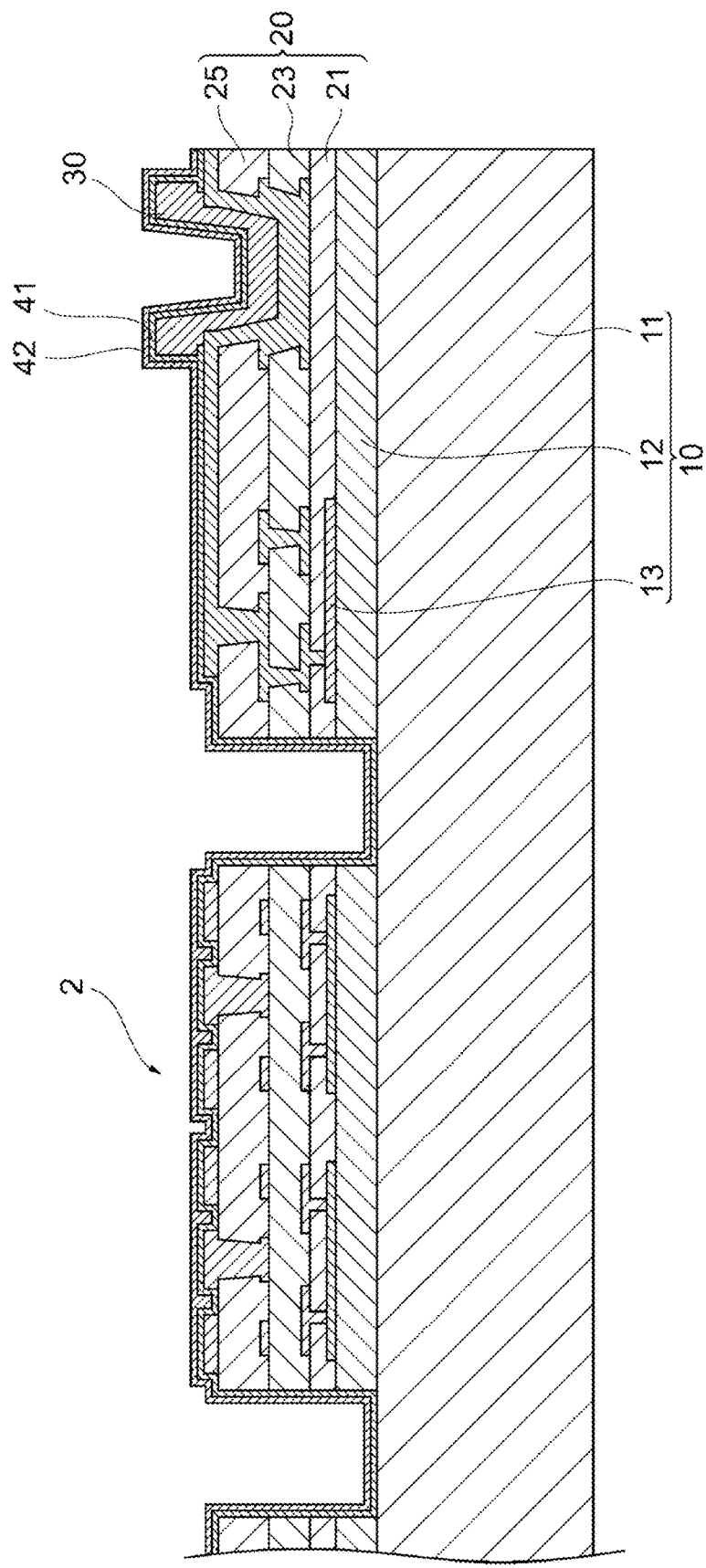
FIG. 10 is a process cross-sectional view of the method of manufacturing the electronic device according to the present embodiment.

Next, as illustrated in FIG. 10, a silicon oxide film 41 is formed on the entire surface of the membrane structure 2, including the upper surface 2a and the side surface 2b, and then a silicon nitride film 42 is formed thereon, thereby forming the passivation film 40 having a two-layer structure constituted of the silicon oxide film 41 and the silicon nitride film 42. The reason for forming the silicon oxide film 41 is to improve the close contact between the interlayer insulating films 21, 23, 25 exposed on a side surface of the membrane structure 2 and the silicon nitride film 42, and to improve strength and device reliability of the membrane structure 2. In FIG. 10, the silicon oxide film 41 and the silicon oxide film 43 are illustrated as a single film.

Figure 11:
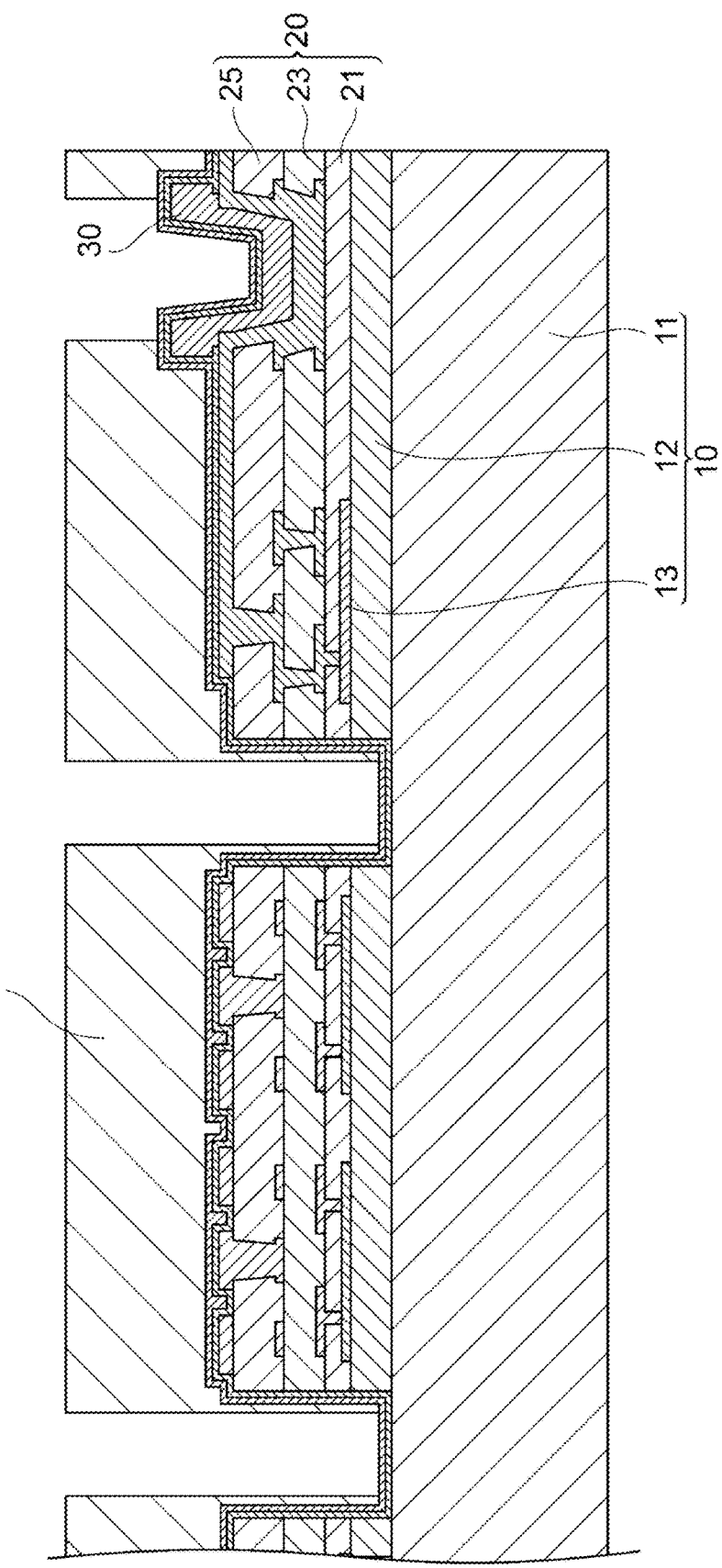
FIG. 11 is a process cross-sectional view of the method of manufacturing the electronic device according to the present embodiment.

Next, as illustrated in FIG. 11, a resist film 53 is formed, and a pattern which opens around the membrane structure 2, the pad P, and a scribe line are formed by exposure and development.

Figure 12:
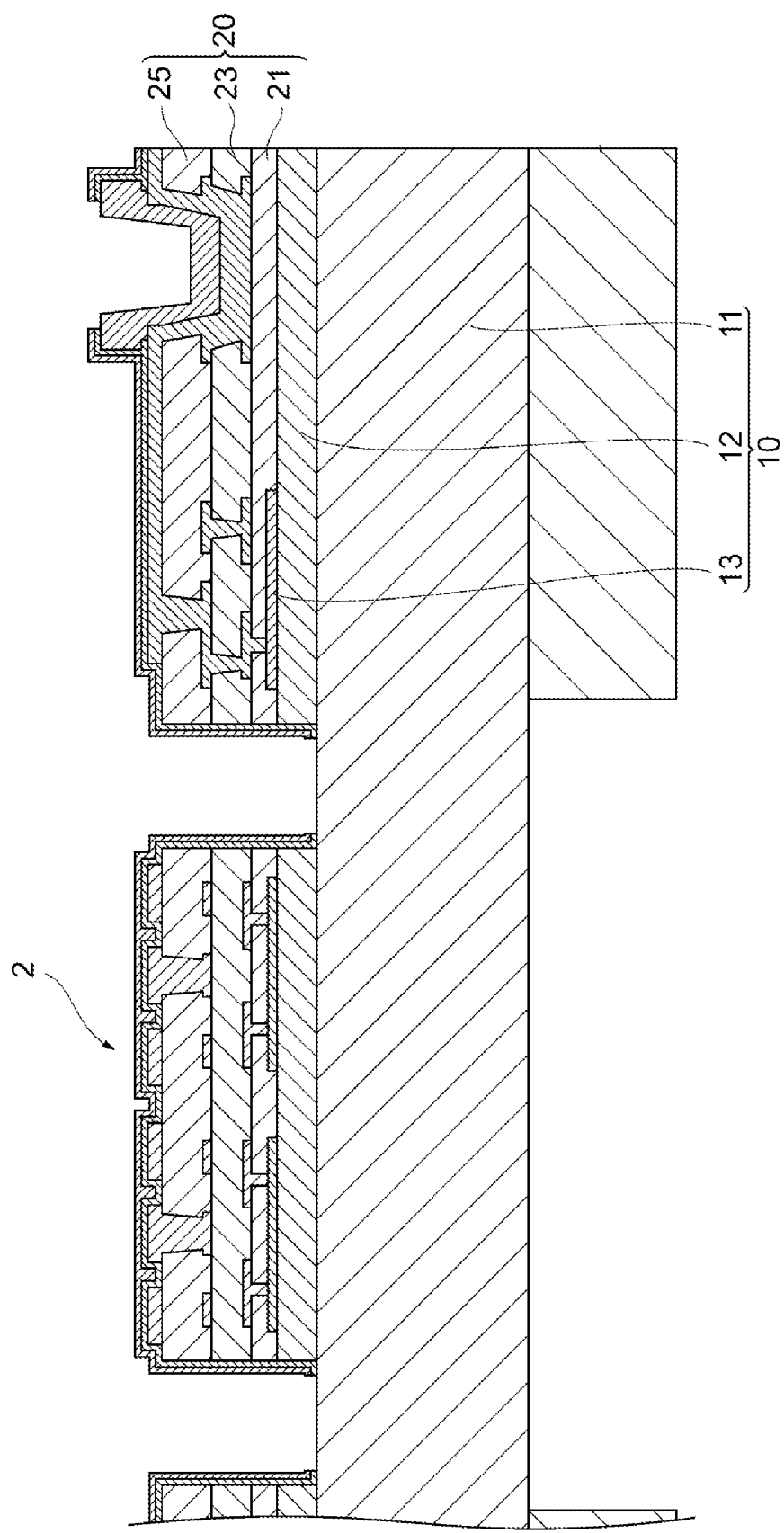
FIG. 12 is a process cross-sectional view of the method of manufacturing the electronic device according to the present embodiment.

Next, as illustrated in FIG. 12, the portion of the silicon oxide film 41 and the silicon nitride film 42 which are exposed in the cavities of the resist film 53 are etched.

Figure 13:
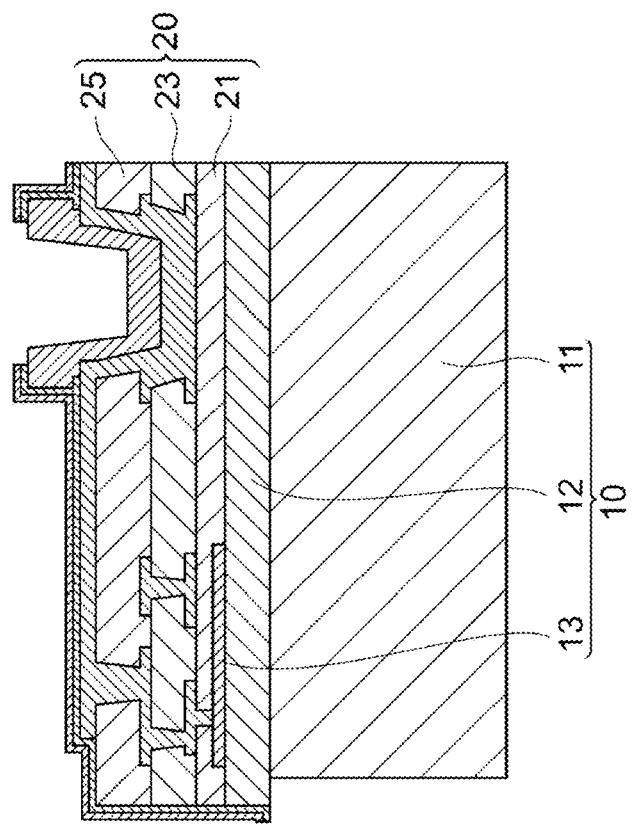
FIG. 13 is a process cross-sectional view of the method of manufacturing the electronic device according to the present embodiment.
Figure 13:
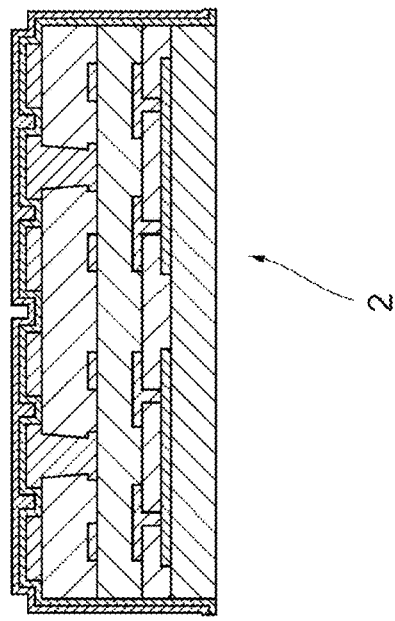
Figure 13:

Next, as illustrated in FIG. 13, the support substrate 11 on a back side of the membrane structure 2 is removed. Specifically, in a state that the membrane structure 2 and the wiring structure 20 on the surface side of the SOI substrate 10 are protected, after the entire surface of the support substrate 11 is ground to form a thin film, the support substrate 11 on the back surface of the membrane structure 2 is removed by etching. Incidentally, the support substrate 11 of the scribe line is left unetched.

Thus, the electronic device according to the present embodiment is manufactured.

By the manufacturing method of the electronic device according to the present embodiment, by covering the upper surface 2a and the side surface 2b of the membrane structure 2 with the continuous passivation film 40, it is possible to prevent moisture and various gas components from entering through the side surface 2b of the membrane structure 2, and thereby improve stability of electronic device characteristics. In addition, it is possible to prevent corrosion of metal wiring and film peeling of the interlayer insulating film, and thereby improve reliability of the electronic device. In the electronic device including the membrane structure 2, since the membrane structure 2 vibrates, stress applied to a membrane interface also increases. According to the present embodiment, by covering the side surface 2b of the membrane structure 2 with the continuous passivation film 40, mechanical strength of the membrane structure 2 can also be increased.

In the manufacturing method of the electronic device described with reference to FIGS. 2 to 13, formation of at least one of the silicon oxide film 43 and the silicon oxide film 41 may be omitted. In this manner, since film formation and processing of SiOx can be omitted once, cost can be reduced.

When the external electrode 30 is not formed on the pad P, the steps of FIGS. 4 to 6 can be omitted. Further, an upper layer film may be formed after the step of forming the passivation film 40.

Exemplary embodiments and examples of the present invention have been described above.

The electronic device according to one aspect of the present embodiment includes: a plurality of layers formed on a silicon-on-insulator (SOI) substrate including a support substrate, a buried insulating layer formed on the support substrate, and a silicon layer formed on the buried insulating layer; a membrane structure in which the plurality of layers and the SOI substrate are patterned, the membrane structure being constituted of a portion where the support substrate is absent; and a passivation film covering an upper surface and a side surface of the membrane structure. In the electronic device according to the present embodiment, since the upper surface and the side surface of the membrane structure are covered with the passivation film, it is possible to prevent moisture and various gas components from entering through the side surface of the membrane structure, and thereby improve stability of electronic device characteristics. Further, film peeling of the membrane structure can be prevented, and reliability of the electronic device can be improved. In the electronic device including a membrane structure, since the membrane structure vibrates, stress applied to the membrane interface also increases. According to the present embodiment, by covering the side surface of the membrane structure with the continuous passivation film, mechanical strength of the membrane structure can also be increased.

The passivation film is formed of a silicon nitride film. Thus, it is possible to prevent moisture and various gas components from entering through the side surface of the membrane structure.

The passivation film includes a silicon oxide film formed on an upper surface and a side surface of the membrane structure and a silicon nitride film formed on the silicon oxide film.

By forming the silicon oxide film between the membrane structure and the silicon nitride film, close contact of the silicon nitride film to the membrane structure can be improved.

A scribe line is formed by removing a layer from a plurality of layers to a buried insulating layer in a partial region, and a side surface of the plurality of layers on both sides of the scribe line is covered with a passivation film. Since end faces of the plurality of layers are also exposed on the both sides of the scribe line, problems due to suction and entrance of moisture and gas similarly arise. By simultaneously fabricating the scribe line while processing a surface side of the membrane, it is possible to suppress occurrence of such problems. Further, it is possible to obtain an effect of suppressing problems such as cracks and film peeling that occur at the time of scribing (because the interlayer films need not be shaved directly).

The passivation film has a protrusion of 5 µm or less on the side surface of the membrane structure. This protrusion inevitably occurs when the passivation film is processed.

A method of manufacturing an electronic device according to the present embodiment includes: a step of forming a plurality of layers on a silicon-on-insulator (SOI) substrate including a support substrate, a buried insulating layer formed on the support substrate, and a silicon layer formed on the buried insulating layer; a step of forming a pattern of a membrane structure by removing a layer from the plurality of layers to the buried insulating layer in a partial region; and a step of forming a passivation film covering an upper surface and a side surface of the membrane structure. By covering the upper surface and the side surface of the membrane structure with the passivation film in this manner, it is possible to prevent moisture and various gas components from entering through the side surface of the membrane structure, and thereby improve stability of the electronic device characteristics. In addition, film peeling of the plurality of layers can be prevented, and reliability of the electronic device can be improved. In the electronic device including a membrane structure, since the membrane structure vibrates, stress applied to the membrane interface also increases. According to the present embodiment, by covering the side surface of the membrane structure with the continuous passivation film, mechanical strength of the membrane structure can also be increased.

The embodiments described above are intended to facilitate understanding of the present invention and are not intended to limit the present invention. The elements included in the embodiments and arrangements, materials, conditions, shapes, sizes, and so on of the elements are not limited to those exemplified and can be appropriately changed. In addition, it is possible to partially replace or combine configurations illustrated in different embodiments.

DESCRIPTION OF REFERENCE SYMBOLS

2: membrane structure
2a: upper surface
2b: side surface
10: SOI substrate
11: support substrate
12: buried insulating layer
13: silicon layer
20: wiring structure
21: interlayer insulating film
22: wiring layer
23: interlayer insulating film
24: wiring layer
25: interlayer insulating film
26: wiring layer
30: external electrode
40: passivation film
40A: protrusion
41: silicon oxide film
42: silicon nitride film
43: silicon oxide film
51 and 53: resist film
P: pad

The invention claimed is:

1. An electronic device, comprising:
(A) a membrane structure having an upper surface and side surfaces extending downwardly from the upper surface, the membrane structure including:
(i) a buried insulating layer having an upper surface;
(ii) a silicon layer covering a portion of the upper surface of the buried insulating layer, the silicon layer having an upper surface; and
(iii) a three layer wiring structure covering the upper surfaces of the buried insulating layer and the silicon layer, the three layer wiring structure including:
(a) a first interlayer insulating film located on the upper surfaces of the buried insulating layer and the silicon layer;
(b) a first wiring layer located on the first interlayer insulating film;
(c) a second interlayer insulating film covering the first wiring layer;
(d) a second wiring layer located on the second interlayer insulating film;
(e) a third interlayer insulating film covering the second wiring layer; and
(f) a third wiring layer located on the third interlayer insulating film; and
(B) a continuous passivation film formed on the upper surface and all of the side surfaces of the membrane structure so as to prevent, or at least reduce, entrance of gas and moisture through the outermost side surfaces of the membrane structure.

2. The electronic device according to claim 1, further including contact plugs extending through respective ones of the interlayer insulating films and connecting respective ones of the wiring layers.

3. The electronic device according to claim 1, wherein the passivation film is formed of a silicon nitride film.

4. The electronic device according to claim 3, wherein the passivation film comprises a silicon oxide film formed on the upper and side surfaces of the membrane structure and a silicon nitride film formed on the silicon oxide film.

5. The electronic device according to claim 1, wherein the passivation film comprises a silicon oxide film formed on the upper and side surfaces of the membrane structure and a silicon nitride film formed on the silicon oxide film.

6. The electronic device according to claim 1, wherein the passivation film has a protrusion of 5 μm or less on the side surface of the membrane structure.

7. The electronic device according to claim 1, wherein the upper surface of the membrane structure is the outermost upper surface of the membrane structure and the side surfaces of the membrane structure are the outermost side surfaces of the membrane structure.

8. The electronic device according to claim 1, further including a support substrate on which the buried insulating layer is formed.

9. The electronic device according to claim 1, wherein the passivation film is formed on all exposed portions of the upper surface and the entire side surfaces of the membrane structure.

10. An electronic device comprising:
(a) a membrane structure having an upper surface and side surfaces extending downwardly from the upper surface, the membrane structure including:
(i) a buried insulating layer having an upper surface;
(ii) a silicon layer covering a portion of the upper surface of the buried insulating layer, the silicon layer having an upper surface; and
(iii) a wiring structure which is in direct contact with the upper surfaces of both the buried insulating layer and the silicon layer; and
(b) a continuous passivation film formed on the upper surface and all of the side surfaces of the membrane structure so as to prevent, or at least reduce, entrance of gas and moisture through the outermost side surfaces of the membrane structure.

* * * * *